(12) United States Patent
Lee et al.

(10) Patent No.: US 7,106,974 B2
(45) Date of Patent: Sep. 12, 2006

(54) LOW-COST WDM SOURCE WITH AN INCOHERENT LIGHT INJECTED FABRY-PEROT LASER DIODE

(75) Inventors: Chang Hee Lee, Taejon (KR); Hyun Deok Kim, Daegu (KR)

(73) Assignee: Korea Advanced Institute of Science & Technology, Taejon (KR)

( * ) Notice: Subject to any disclaimer, the term of this patent is extended or adjusted under 35 U.S.C. 154(b) by 1006 days.

(21) Appl. No.: 09/732,773

(22) Filed: Dec. 11, 2000

(65) Prior Publication Data

US 2001/0004290 A1 Jun. 21, 2001

(30) Foreign Application Priority Data

Dec. 21, 1999 (KR) ................. 1999-59923

(51) Int. Cl.
*H04B 10/00* (2006.01)
(52) U.S. Cl. ............... 398/168; 398/79; 372/32; 372/28
(58) Field of Classification Search ........... 372/32, 372/28; 398/79, 168
See application file for complete search history.

(56) References Cited

U.S. PATENT DOCUMENTS

| | | | |
|---|---|---|---|
| 4,563,087 A * | 1/1986 | Bourbin et al. ............ 356/73.1 |
| 5,202,780 A | 4/1993 | Fussanger |
| 5,221,983 A | 6/1993 | Wagner |
| 5,276,543 A | 1/1994 | Olshansky |
| 5,321,541 A | 6/1994 | Cohen |
| 5,436,760 A | 7/1995 | Nakabayashi |
| 5,440,417 A | 8/1995 | Chung et al. |
| 5,550,666 A | 8/1996 | Zirngibl |
| 5,661,585 A | 8/1997 | Feldman et al. |
| 5,694,234 A | 12/1997 | Darcie et al. |
| 5,793,512 A * | 8/1998 | Ryu ........................ 398/97 |
| 5,880,865 A | 3/1999 | Lu et al. |
| 6,097,523 A | 8/2000 | Boot |
| 6,137,611 A * | 10/2000 | Boivin et al. ............ 398/168 |
| 6,650,840 B1 * | 11/2003 | Feldman .................. 398/21 |
| 2001/0004290 A1 | 6/2001 | Lee et al. |

OTHER PUBLICATIONS

Kim, Hyun, et al., "A Low-Cost WDM Source With An ASE Injected Fabry-Perot Semiconductor Laser," IEEE Photonic Technology Letters, pp. 1067-1069, vol. 12, No. 8 (Aug. 2000).
Feldman, Robert D., et al., "An Evaluation of Architectures Incorporating Wavelength Division Multiplexing for Broad-Band Fiber Access," Journal of Lightwave Technology, vol. 16, No. 9, pp. 1546-1559, (Sep. 1998).

* cited by examiner

*Primary Examiner*—David C. Payne
(74) *Attorney, Agent, or Firm*—Bacon & Thomas, PLLC

(57) ABSTRACT

The present invention discloses a low-cost light source for optical transmission systems and optical networks based on wavelength-division multiplexing (WDM) technology. A light source in accordance with the present invention is implemented by externally injecting a narrow-band incoherent light into a Fabry-Perot laser diode (F-P LD). After injection of narrow-band incoherent light, the output of F-P LD becomes wavelength-selective rather than multi-mode and the output wavelength of F-P LD coincide with the peak wavelength of the injected incoherent light.

Multi-channel WDM light sources according to the present invention can be implemented using a single broadband incoherent light source and plurality of F-P LDs. An optical transmission system for upstream signal transmission in an passive optical network using the light source according the present invention is also disclosed.

40 Claims, 11 Drawing Sheets

LOW-COST WDM SOURCE WITH AN INCOHERENT LIGHT INJECTED FABRY-PEROT LASER DIODE

BACKGROUND OF THE INVENTION

1. Field of the Invention

The present invention relates to a light source for optical transmission systems and optical networks based on the wavelength-division multiplexing (WDM) technology, and more particularly to a light source employing a Fabry-Perot laser diode (F-P LD) whose output wavelength is locked by an externally injected incoherent light.

The present invention also relates to WDM transmission systems and WDM passive optical networks using the above-described light sources.

2. Description of the Related Art

Recently, WDM transmission systems are widely deployed to meet the ever-growing bandwidth demands incurred by the explosion of the data traffic. In particular, WDM transmission systems begin to be deployed in metropolitan networks and access networks to accommodate wide-band services such as an electronic commerce, a cable TV, a video conference, and son on.

FIG. 1 shows a configuration of conventional WDM transmission system.

The source node is equipped with multiple transmitters (TXs) with different wavelengths ($\lambda_1 \sim \lambda_N$) and a N×1 multiplexer (MUX) and the destination node is equipped with an 1×N demultiplexer (DMUX) and multiple receivers (RXs). The source node and the destination node are connected through an single strand of optical link composed of optical fibers and optical amplifiers.

In WDM transmission systems described above, communication channels between the source node and the destination node are distinguished one another by their wavelengths. Thus, a unique wavelength is allocated each transmitter-receiver pair. The light source of transmitter must have the unique wavelength with long-term stability and a large side mode suppression ratio (SMSR) to minimize the interference between neighboring channels. In addition, it is desirable that the light source provides a sufficient output power and has a narrow spectral width.

A representative light source which satisfies the requirements mentioned above is a distributed feedback laser diode (DFB LD). However, since a distributed feedback laser diode is expensive, incoherent light sources are usually used in an access network in which the main concern is the economical competitiveness The incoherent light sources, such as a light emitting diode (LED), a super-luminescent diode (SLD), and an optical fiber amplifier generating amplified spontaneous emission (ASE), have been used in WDM transmission systems through a spectrum-slicing application. The LED can be fabricated at low cost and modulated directly. However, the output power of LED is not sufficient to accommodate many channels through a spectrum-slicing application. The SLD is costly although it can provide much higher output power than the LED. The optical fiber amplifier can provide a strong incoherent light, ASE, but it requires expensive external modulators.

The F-P LD can provide much higher output power than the LED at the comparable cost with the LED. However, its output is multi-mode and the output power of each mode fluctuates randomly with the time due to the mode hopping and the mode partitioning. Therefore, it has been used in optical transmission systems based on time-division multiplexing technology (TDM) rather than WDM technology. Its application wavelength region was also limited near the zero dispersion wavelength of the optical fiber.

SUMMARY OF THE INVENTION

The objective of the present invention is to provide a low-cost light source for WDM application. The light source according to the present invention is implemented by externally injecting a narrow-band incoherent light into a F-P LD. Its output is wavelength-locked by the externally injected light and thus becomes wavelength-selective.

The other objective of the present invention is to provide WDM transmission systems and WDM passive optical networks employing the light source according to the present invention. The multiple sliced incoherent lights generated from a single broadband incoherent light source are injected into multiple F-P LDs simultaneously to produce multi-channel WDM light sources.

DESCRIPTION OF THE NUMERICS ON THE MAIN PARTS OF THE DRAWINGS

TX: a transmitter
RX: a receiver
MUX: a multiplexer
DMUX: a demultiplexer
ILS: an incoherent light source
TF: a tunable optical filter
CIR: an optical circulator
Pol: a polarizer
PC: a polarization controller
F-P LD: a Fabry-Perot laser diode ILS: an incoherent light source
BPF: a band pass filter
(D)MUX: (de)MUX
ASE source: an ASE source
WGR: a waveguide grating router
AMP1, AMP2: an optical amplifier
Att.1, Att.2: an optical variable attenuator
PZF: a polarizing fiber
SMF: a conventional single mode fiber
PM: an power meter

DETAILED DESCRIPTION OF THE EMBODIMENTS

It is well known that the F-P LD shows a multi-mode output and the mode power is proportional to the spontaneous emission coupled to the mode. The output spectral distribution of the F-P LD can be changed by externally injecting a strong light into the F-P LD. Then, a mode that is the nearest from the peak wavelength of the injected light is locked by the injected light and the other modes may be suppressed. Namely, the output wavelength of F-P LD coincides with the peak wavelength injected light. As a result we can obtain a wavelength-selective output from multi-mode laser, F-P LD.

Hereinafter, referring to appended drawings, desirable embodiments of the present invention are described in detail.

Figure 1:
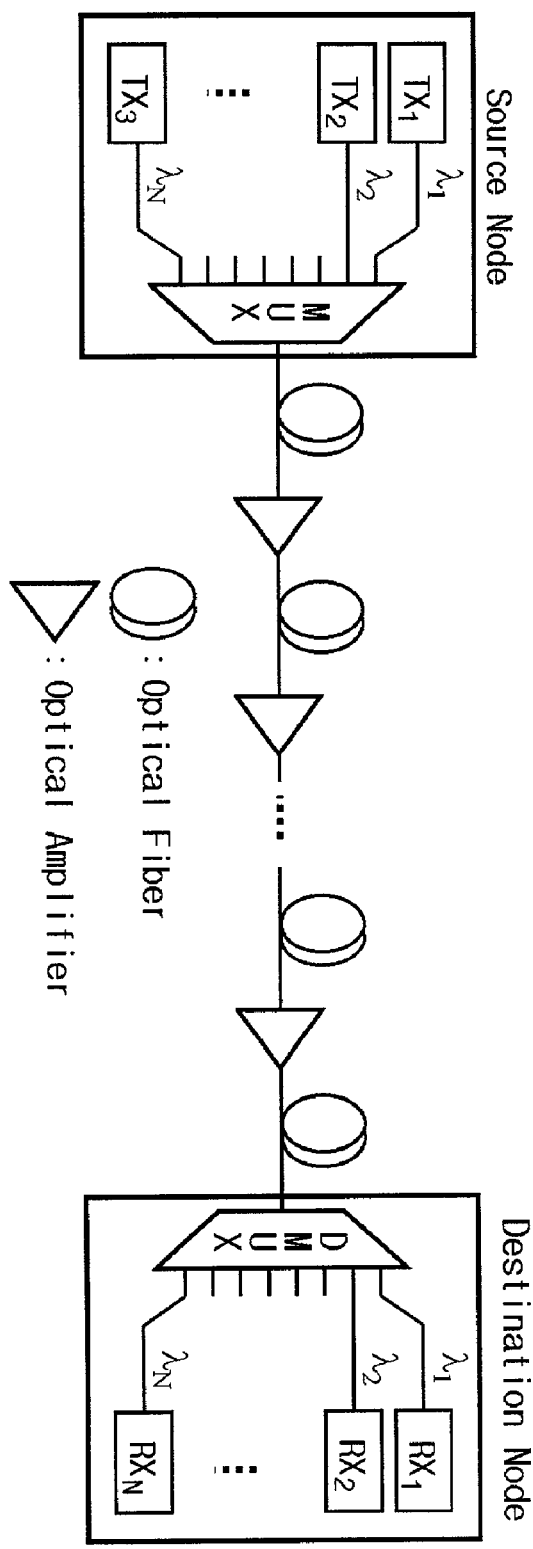
FIG. 1 shows a configuration of conventional WDM transmission system.
Figure 2:
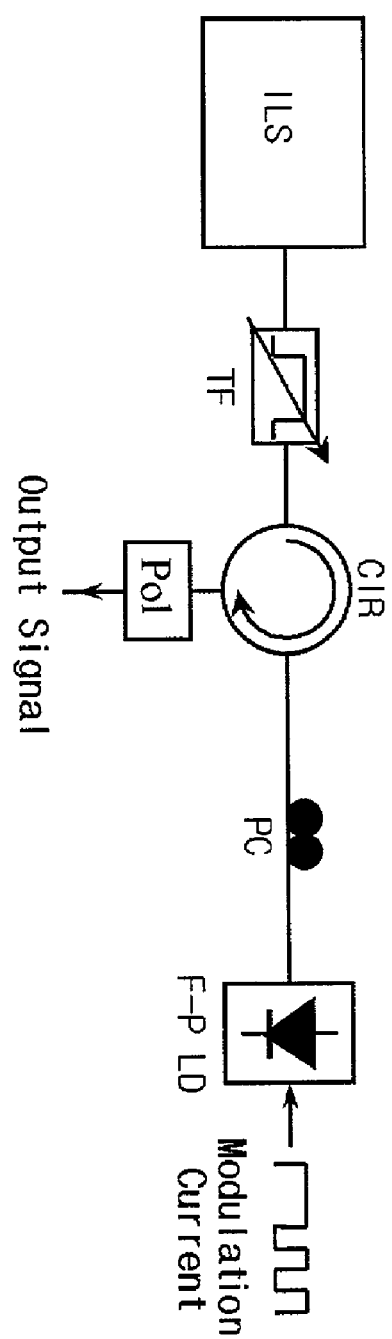
FIG. 2 shows the schematic diagram of the light source according to the present invention.

FIG. 2 is a schematic diagram of the light source according to the embodiment of the present invention. The light source comprises: an incoherent light source (ILS); a tunable optical filter (TF) connected to said incoherent light source; an optical circulator (CIR) connected to said tunable optical filter; and a F-P LD without optical isolator connected to said optical circulator.

Optionally, the light source according to the embodiment of the present invention further comprises: a polarization controllers (PC) connected between said optical circulator and said F-P LD; and a polarizer (Pol) connected at the output end of said optical circulator.

In the embodiment, the incoherent light source is any one of an optical fiber amplifier generating ASE, an LED, or a SLD.

The operation principles of the light source according to the present embodiment are as follows:

The broadband incoherent light generated from the incoherent light source is sliced by the tunable optical filter to produce a narrow-band incoherent light. The narrow-band incoherent light is injected into the F-P LD through the optical circulator. The optical circulator separates the narrow-band incoherent light and the output of F-P LD. Thus the output of the light source according to the present embodiment comes out through the output end of the optical circulator.

When the F-P LD is biased above the threshold current, the output of the F-P LD is multi-mode. However, it becomes wavelength-selective after injection of the narrow-band incoherent light since a strong light is coupled to a specific mode of the F-P LD. The output wavelength of F-P LD is locked to the injected incoherent light and thus can be tuned by changing the pass-band of the tunable optical filter.

The output power of the F-P LD can be changed by controlling the bias current applied to the F-P LD. Thus, we can modulate the light source directly. When the bias current is lower than the threshold current, the output of the light source is a reflected incoherent light at the interface of the pig-tailing fiber and the air. The output of F-P LD is polarized but reflected incoherent light is unpolarized. Using this characteristics, the extinction ratio of the modulated signal can be improved by further comprosing a polarization controller (PC) and a polarizer (Pol).

In the light source according to the present embodiment, an optical circulator (CIR) can be replaced by an optical power splitter.

Using the same principles as that of the embodiments described above, multi-channel WDM light source can be implemented.

Figure 3:
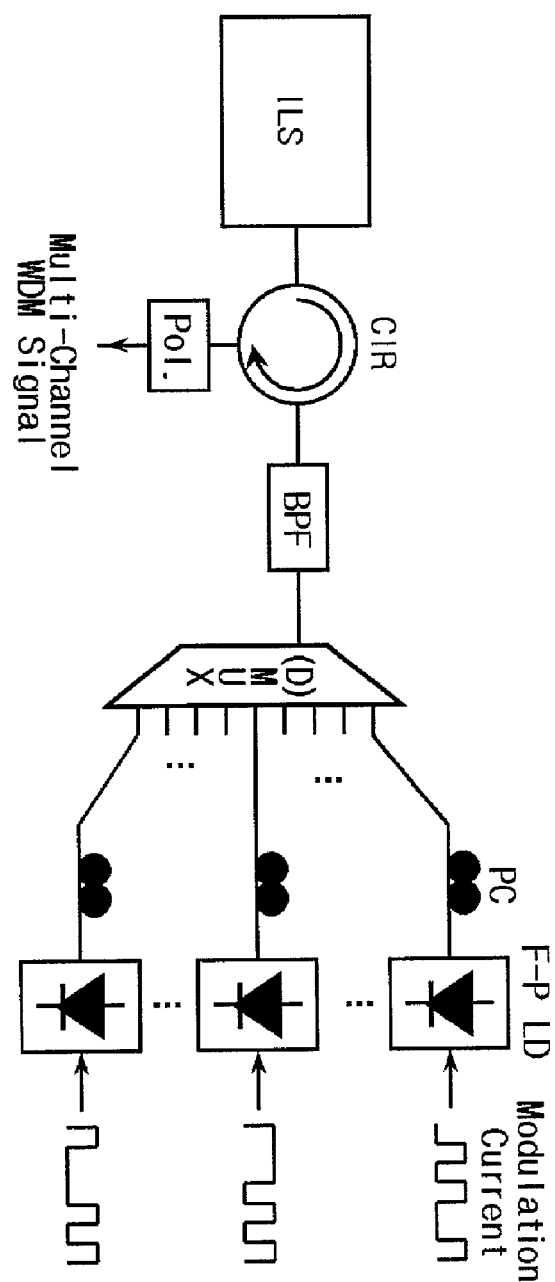
FIG. 3 is a schematic diagram of multi-channel WDM light sources in accordance with the present invention.

FIG. 3 shows schematic diagram of the multi-channel WDM light source in accordance with the embodiment of the present invention.

The multi-channel WDM light source comprises: an incoherent light source (ILS); an optical circulator (CIR) connected to said incoherent light source; a (de)multiplexer ((D)MUX) connected to said optical circulator; and plurality of F-P LDs without optical isolator connected at the output end of the said (de)multiplexer.

If the bandwidth of the incoherent light generated said incoherent light source is larger than the free spectral range (FSR) of said (de)multiplexer, the light source further comprises a band-pass filter (BPF) that is connected between said optical circulator (CIR) and said (de)multiplexer. The band-pass filter restricts the bandwidth of the incoherent light entering the (de)multiplexer within the free spectral range (FSR) of an the (de)multiplexer.

Optionally, the light source further comprises: plurality of polarization controllers (PC) connected between the output ends of the said (de)multiplexer and said F-P LDs; and a polarizer (Pol) connected at the output end of said optical circulator.

In the embodiment, the incoherent light source is any one of an optical fiber amplifier generating ASE, an LED, or a SLD.

The operation principles of the multi-channel WDM light source in the present embodiment is as follows:

The broadband incoherent light generated from the incoherent light source is transmitted to the (de)multiplexer through the optical circulator. The (de)multiplexer receives and slices the broadband incoherent light. Then, the sliced narrow-band incoherent light with different wavelengths are injected simultaneously into the plurality of F-P LDs.

After injection of incoherent light, the output of each F-P LD becomes wavelength-selective and is locked by the injected narrow-band incoherent light. Namely, the output wavelength of each F-P LD coincides with the peak wavelength of the (de)multiplexer pass-band. The outputs of the F-P LDs are multiplexed by the (de)multiplexer. Then, the multi-channel WDM signals come out through the output end of the optical circulator.

The output power of multi-channel WDM light source can be controlled independently and thus multi-channel WDM light source can be modulated directly. We can increase the extinction ratio of the modulated signal by further comprising a polarizer (Pol) and plurality of polarization controllers (PC).

In the multi-channel WDM light source according to the present embodiment, an optical circulator (CIR) can be replaced by an optical power splitter.

Figure 4A:
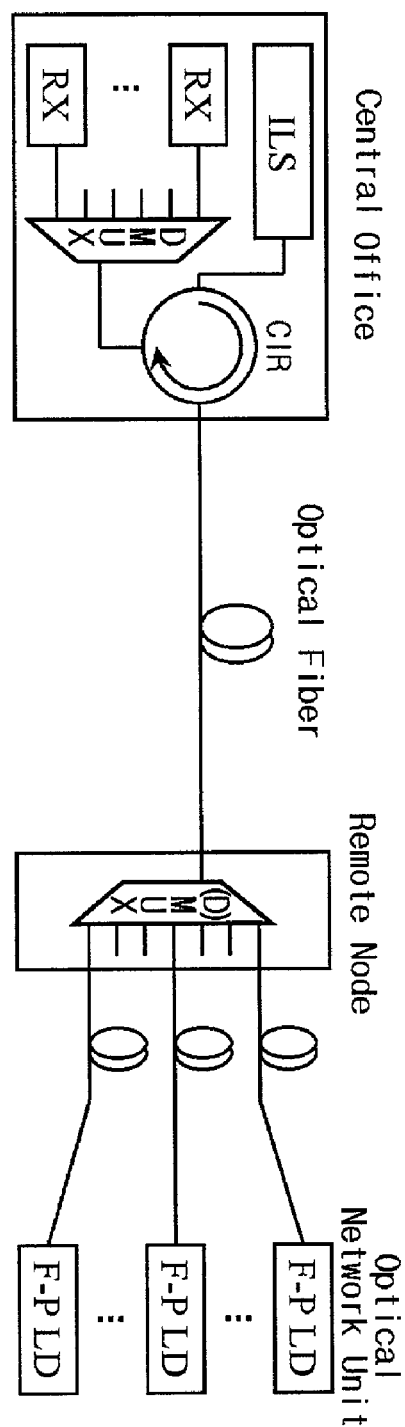
FIG. 4a and FIG. 4b show schematically the optical transmission systems for upstream signal transmission in passive optical networks employing the light source in accordance with an embodiment of the present invention.

FIG. 4a shows a schematic diagram the optical transmission system for upstream signal transmission in a passive optical network using the multi-channel WDM light source in accordance with the present invention.

The passive optical network of the present embodiment comprises a central office, a remote node connected to the central office with a single optical fiber, and plurality of optical network units connected to the remote node with plurality of optical fibers;

wherein the central office comprises: an incoherent light source (ILS); a demultiplexer (DMUX); an optical circulator that route the output of said incoherent light source to the optical fiber connecting said central office and said remote and the upstream signal transmitted from said remote through said optical fiber to said demultiplexer; and plurality of receivers (RX) connected at the output ends of the said demultiplexer, the remote node comprises: an (de)multiplexer that receives the broadband incoherent light transmitted from said central offices, slices said incoherent light spectrally to produce plurality of narrow-band incoherent lights and multiplexes the upstream signals from said optical network units, and the plurality of optical network units comprise a F-P LD that is connected to the output ends of the (de)multiplexer in the remote node with said plurality of optical fibers.

Under this configuration, the upstream signals generated from the optical network units have different wavelengths and multi-channel WDM signal is transmitted from the remote node to the central office.

In the passive optical network, electric power is not supplied to the remote node to save the maintenance cost, and thereby the pass-band of the (de)multiplexer in remote node can drift with the temperature change. Therefore, it is important to control the wavelength of the light sources in the optical network units. In case of the passive optical network using the multi-channel WDM light source according to the present invention, the output wavelength of each F-P LD is automatically aligned to the pass-band of the (de)multiplexer in remote node since the output wavelength of the F-P LD is locked by the injected incoherent light.

In the passive optical network described above, the broadband incoherent light transmitted from the central office to the remote node may be reflected to the central office due to the Rayleigh back-scattering of the optical fiber. The reflected light can degrade the signal quality.

Figure 4B:
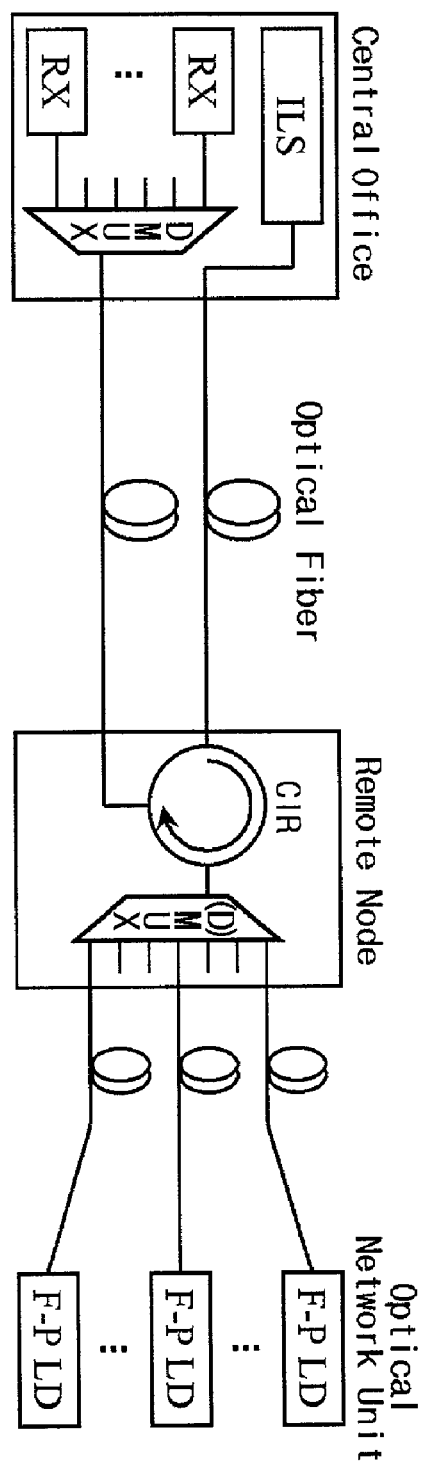

FIG. 4*b* shows a schematic diagram of the optical transmission system for upstream signal transmission in a passive optical network to reduce the signal degradation described above.

As described in the figure, by installing an optical circulator (CIR) at the remote node and separating the optical fiber that delivers the incoherent light from the optical fiber that deliver the upstream signal, the signal degradation caused by the reflection of the incoherent light can be reduced.

In other words, the passive optical network of the present embodiment comprises a central office, a remote node connected said central office with two optical fibers, and plurality of optical network units connected to said remote node with plurality of optical fibers;

wherein the central office comprises: an incoherent light source (ILS) connected to said remote node with an optical fiber; a demultiplexer (DMUX) connected to said remote with the other optical fiber; and plurality of receivers (RX) connected at the output ends of the said demultiplexer, the remote node comprises: a (de)multiplexer that receives the broadband incoherent light transmitted from the central offices, slices said incoherent light spectrally to produce plurality of narrow-band incoherent lights, and multiplexes the upstream signals from said optical network units; and an optical circulator that route the broad-band incoherent light transmitted from said central office to said (de)multiplexer and the upstream signals from said (de)multiplexer to the central office, and the plurality of optical network units comprise F-P LDs connected to the output ends of the (de)multiplexer in the remote node with said plurality optical fibers.

Under this configuration, the upstream signals generated from the optical network units have different wavelengths and multi-channel WDM signal is transmitted from the remote node to the central office.

In optical transmission system for upstream signal transmission in a passive optical network described in FIG. 4*a* and FIG. 4*b*, an optical circulator (CIR) can be replaced by an optical power splitter.

Figure 5:
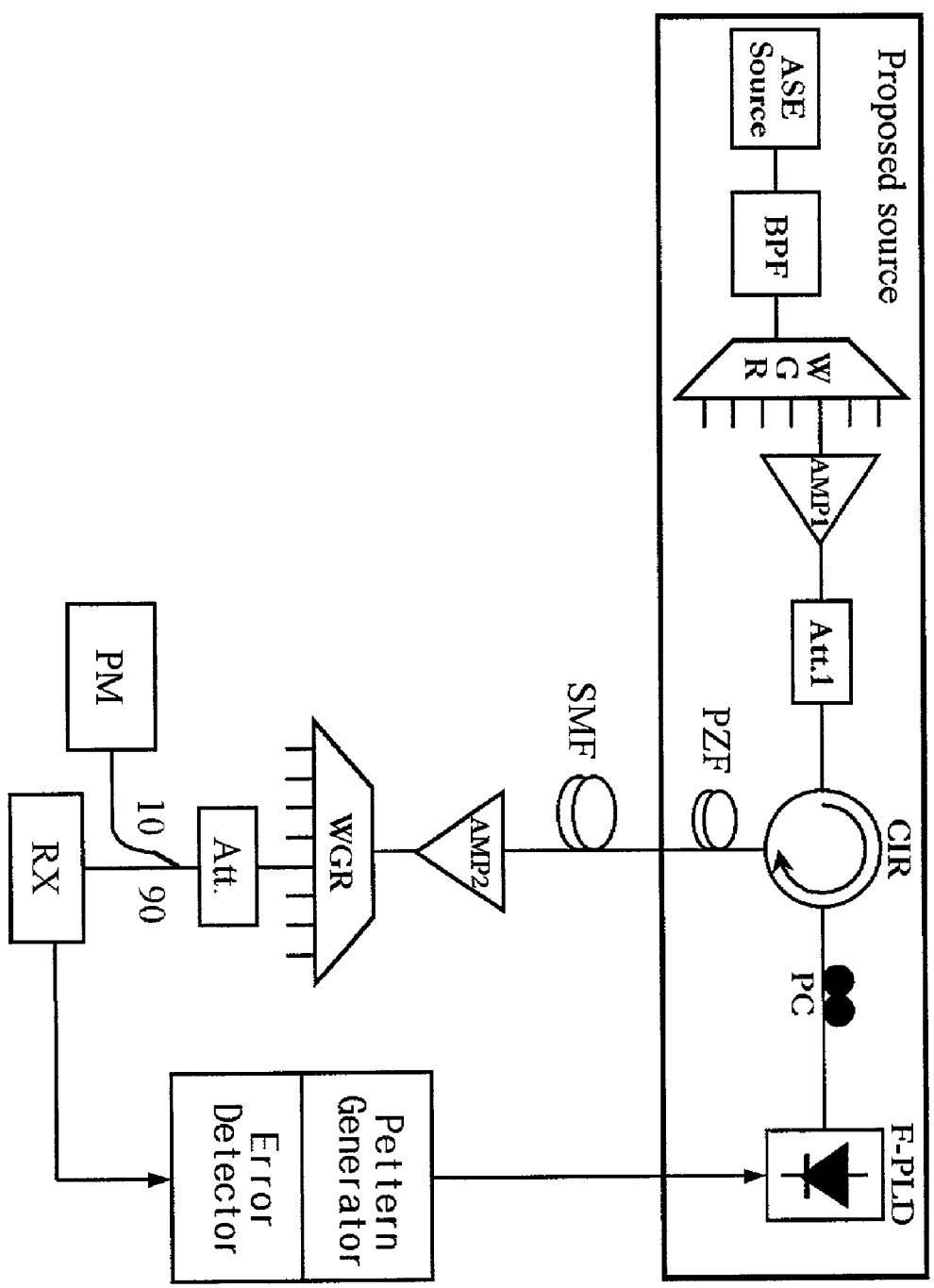
FIG. 5 shows the experimental set-up to demonstrate the feasibility of the light source in accordance with the present invention.

FIG. 5 shows the experimental set-up to demonstrate the feasibility of the light source in accordance with the present invention.

The ASE source was two-stage erbium-doped fiber amplifier (EDFA) pumped counter-directionally with laser diode at 1480 nm. The pump power for the first and the second stage of EDFA were 50 mW and 100 mW, respectively. A band pass filter (BPF) with a bandwidth of 9 nm was used at the output end of the EDFA to limit the spectral width of the ASE within one free spectral range (FSR) of the waveguide grating router (WGR). An optical amplifier (AMP1) and an optical variable attenuator (Att.1) were used to control the ASE power injected into the F-P LD. An optical circulator with insertion loss of 0.7 dB separated the injected broadband ASE and the output of the F-P LD. The broadband ASE was sliced spectrally by an WGR with a bandwidth of 0.24 nm and injected into the F-P LD. A conventional F-P LD without an optical isolator was locked by the externally injected narrow-band ASE. The threshold current of the F-P LD was 20 mA. The coupling efficiency of the F-P LD, the rate of power transferred from laser to pig-tailing fiber or vice versa, was approximately 8%. The F-P LD was modulated directly by pseudorandom nonreturn-to-zero data with a length of $2^7-1$ at 155 Mb/s and its output was transmitted through conventional single mode fiber (SMF). The transmitted data was amplified by an optical amplfier (AMP2), demultiplexed by another WGR with a bandwidth of 0.32 nm, and received by a PIN photo-detector based receiver to measure the bit error rate (BER) characteristics. The receiver input power was controlled by an optical variable attenuator (Att.2) and measured by an optical power meter (PM). A polarization controller (PC) and a polarizing fiber (PZF) with about 47 dB of polarization extinction ratio are used to improve the extinction ratio of the modulated optical signal.

Figure 6:
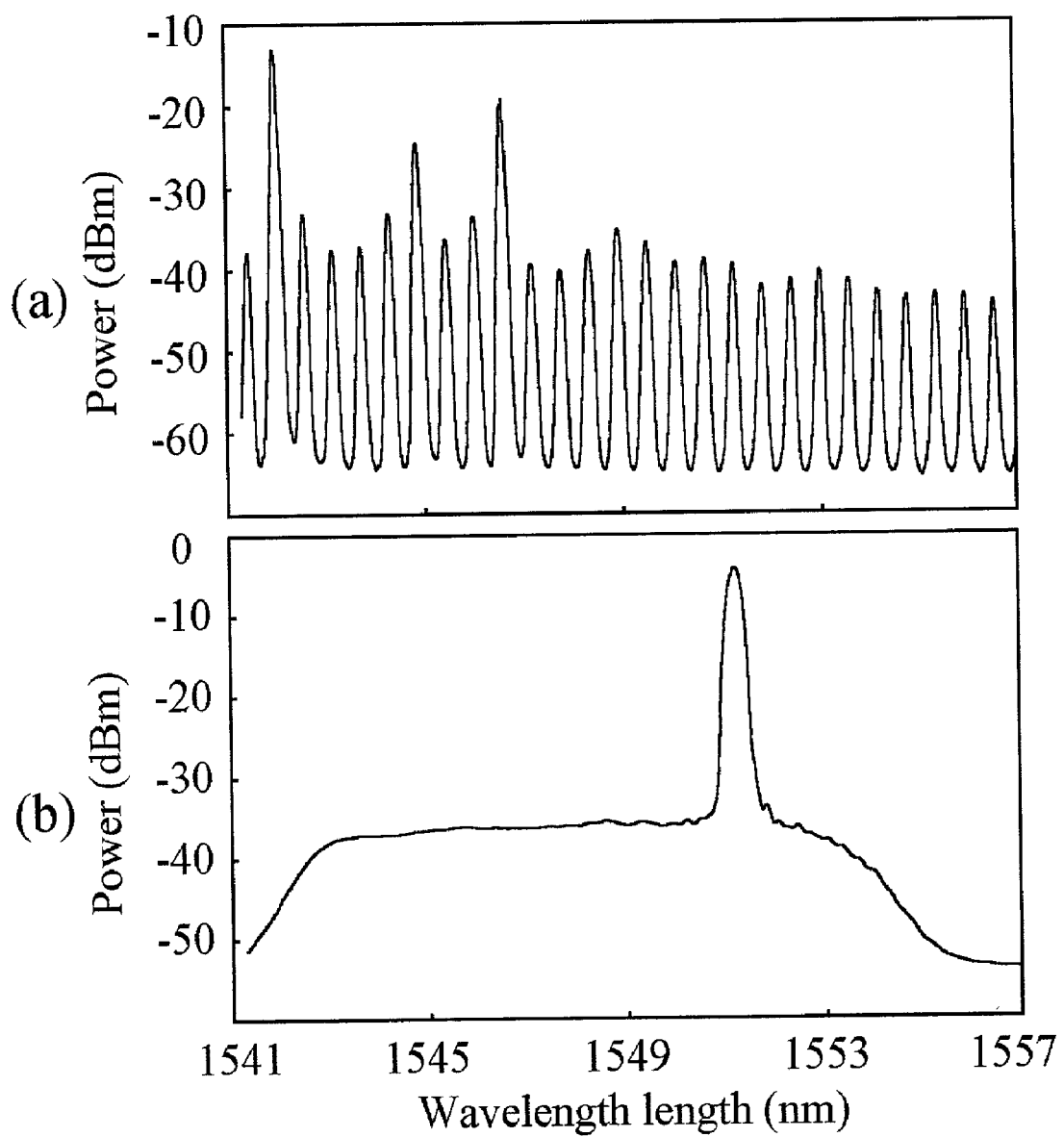
FIG. 6 shows (a) the output spectrum of the F-P LD without external light injection and (b) the spectrum of the narrow-band ASE to be injected into the F-P LD.

FIG. 6 shows (a) the output spectrum of the F-P LD without ASE injection and (b) the spectrum of the narrow-band ASE to be injected into the F-P LD. The bias current was 30 mA and the output power of the F-P LD measured at the output end of the optical circulator was about −10 dBm. The side mode suppression ratio (SMSR) was less than 6 dB. The peak wavelength of narrow-band ASE was about 1551.72 nm.

Figure 7:
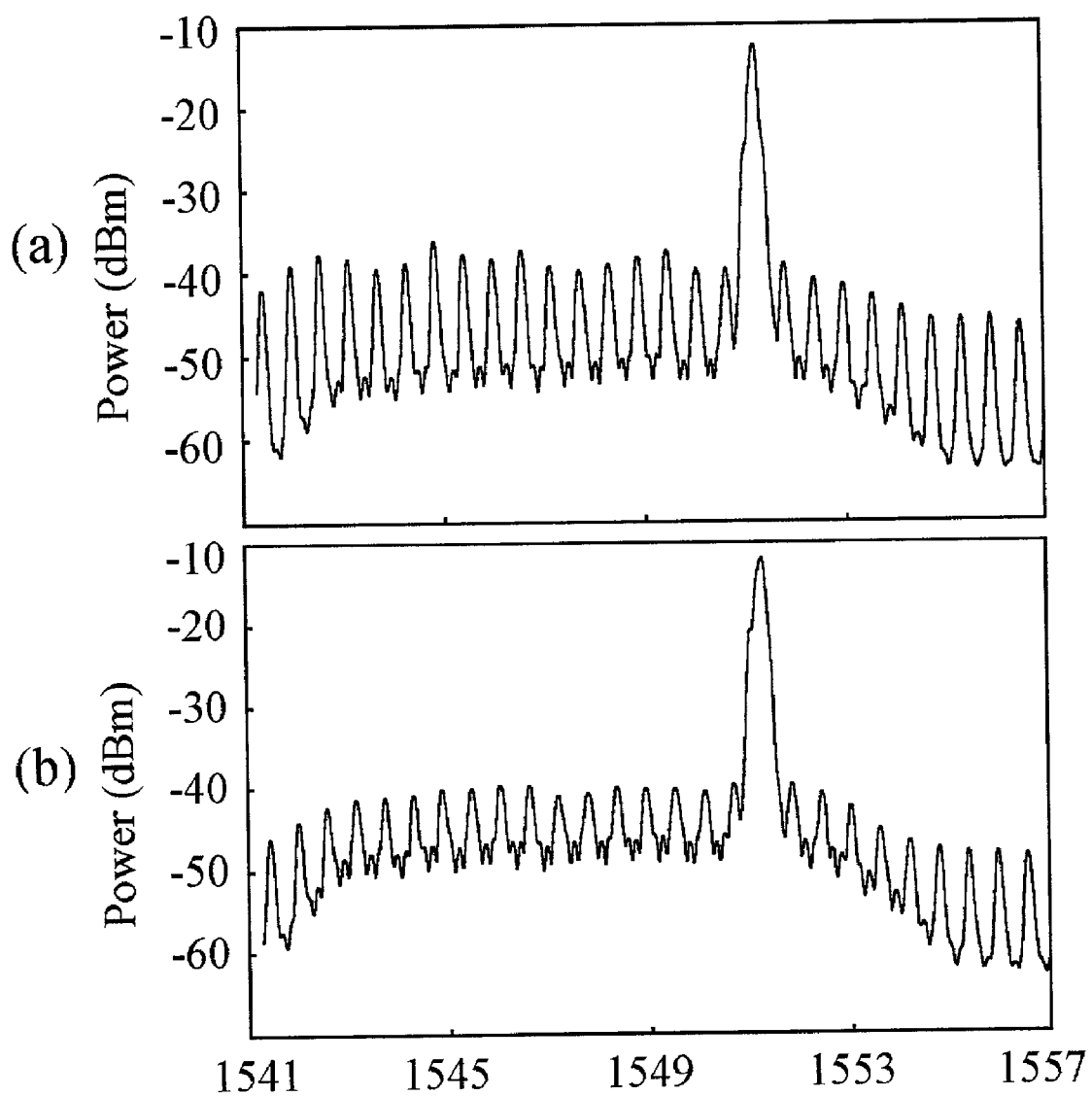
FIG. 7 shows the measured output spectra of the F-P LD after injection of a narrow-band ASE when the injection ASE power were (a) −2 dBm and (b) 2 dBm, respectively.

FIG. 7 shows the measured output spectra of the F-P LD after injection of a narrow-band ASE when the injected ASE power were (a) −2 dBm and (b) 2 dBm, respectively. After ASE injection, the F-P LD was wavelength-locked by the injected ASE. The measured side mode suppression ratio were 25 dB and 27. 3 dB for the injection ASE power of −2 dBm and 2 dBm, respectively.

Figure 8:
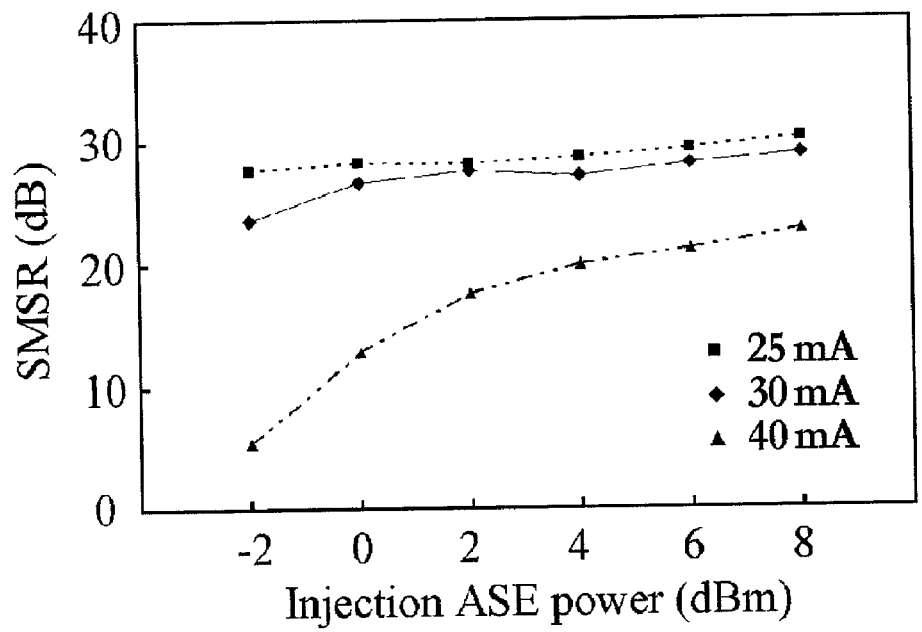
FIG. 8 shows the measured side-mode-suppression-ratio (SMSR) of the light source in accordance with the present invention.

FIG. 8 shows the measured side mode suppression ratio (SMSR) of the light source in accordance with the present invention. The side mode suppression ratios increases as the injected ASE power increases. However, it decreases as the bias current increases.

Figure 9:
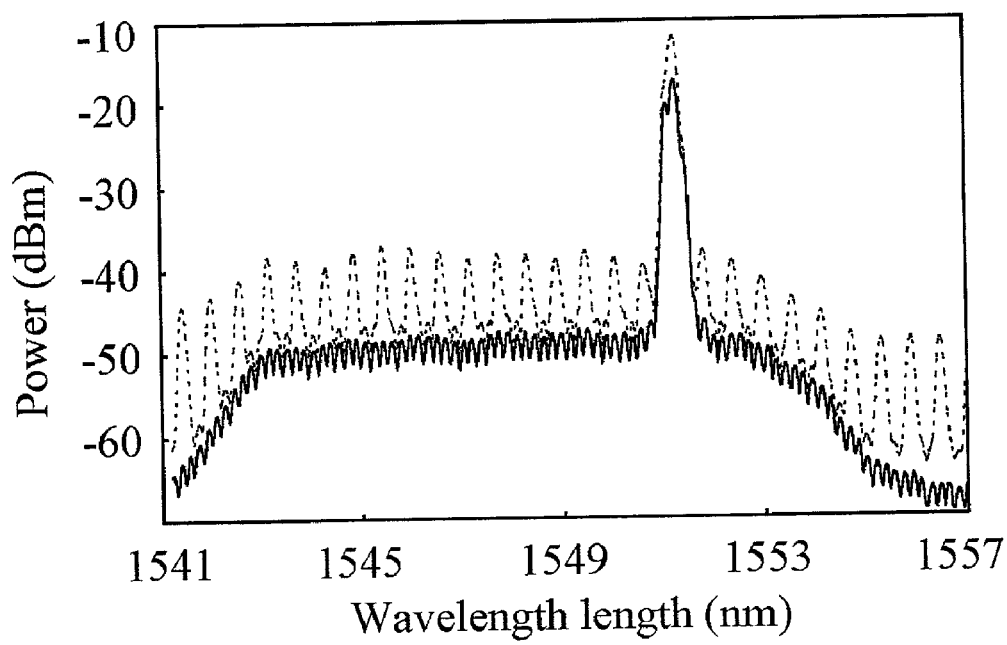
FIG. 9 shows the measured output spectra of the light source in accordance with the present invention for different bias currents.

To measure the modulation characteristics of the light source in accordance with the present invention, we measured optical spectra for different bias currents at the fixed injection ASE power of 2 dBm. FIG. 9 shows the results when the bias current were 30 mA (dotted line) and 0 mA (solid line), respectively. The measured peak power difference between two bias states, here called as extinction ratio, was about 5.8 dB.

Figure 10:
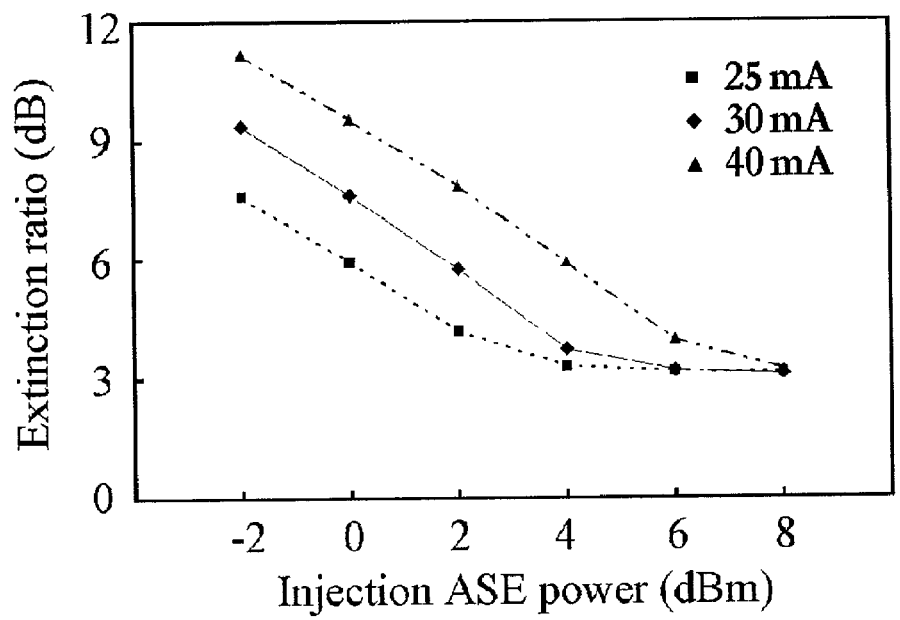
FIG. 10 shows the measured the extinction ratio of the light source in accordance with the present invention.

FIG. 10 shows the measured the extinction ratio of the light source in accordance with the present invention. The extinction ratio decreases as the injection ASE power increases while it increases the as the bias current increases.

Figure 11:
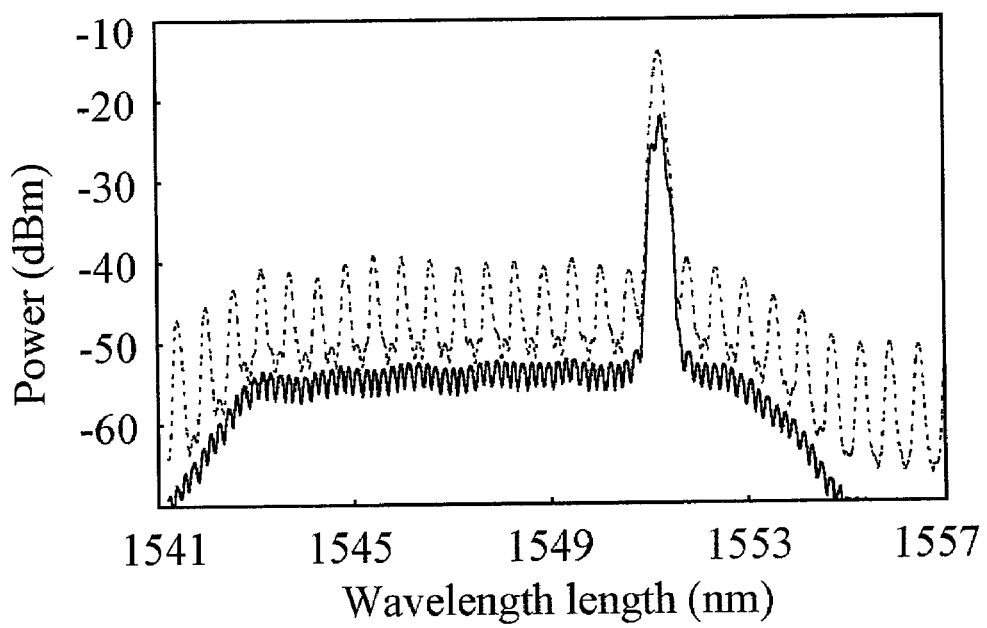
FIG. 11 shows the measured output spectra of the light source in accordance with the present invention when a polarizer and a polarization controller were further used.

We also measured optical spectra by inserting a polarization controller and a polarizer (in the present experiment, a polarizing fiber: PZF) under the same measurement conditions with the FIG. 9. FIG. 11 shows the results. The extinction ratio increases about 2.5 dB from 5.8 dB to 8.3 dB. This means that the output of the light source according to the present invention is polarized.

Figure 12:
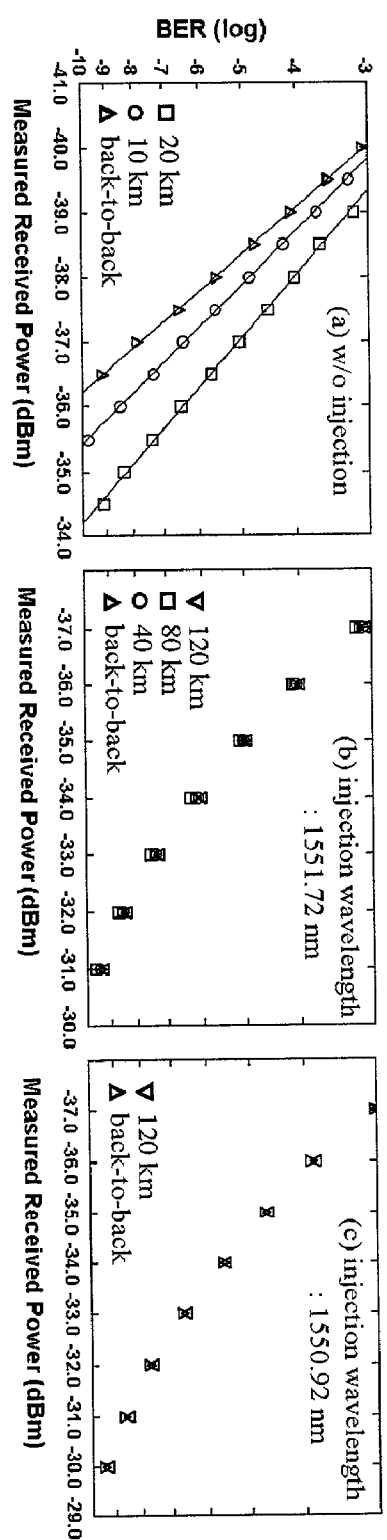
FIG. 12 shows the measured bit error rate.

FIG. 12 shows the measured bit error rate curves. The F-P LD was modulated directly at 155 Mb/s. The amplitudes of dc bias and modulation current were both 20 mA. Before we use the light source according to the present invention, we measured BER characteristics of the directly modulated F-P LD itself, i.e., without ASE injection. The measured power penalty at the BER of $10^{-9}$ was about 2 dB after transmission over 20 km of SMF as shown in FIG. 12(*a*).

The BER characteristics were improved dramatically when we inject a narrow-band ASE into the F-P LD. The power and the peak wavlength of the injected ASE were 1 dBm and 1551.72 nm, respectively. We achieved error free transmission over 120 km of SMF with negligible power penalty as shown in FIG. 12(*b*). We also measured BER characteristics by changing the peak wavelength of the injected narrow-band ASE and observed very similar results. As an example, we show the measured BER curves in FIG. 12(*c*) when the peak wavelength of the injected narrow-band ASE was 1550.92 nm. This result implies that the output wavelength of the light according to the present invention can be tuned by changing the wavelength of the injected ASE.

Since those having ordinary knowledge and skill in the art of the present invention will recognize additional modifications and applications within the scope thereof, the present invention is not limited to the embodiments and drawings described above.

What is claimed is:

1. A method comprising:
   generating a narrow-band incoherent light signal from an optical fiber amplifier;
   externally injecting the narrow-band incoherent light signal into a light source capable of lasing;
   suppressing the lasing modes outside of a bandwidth of the injected incoherent light signal by injecting the narrow-band incoherent light signal; and
   locking an output wavelength of the light source capable of lasing within the bandwidth of the injected incoherent light.

2. A method comprising:
   generating a narrow-band incoherent light signal from a light emitting diode;
   externally injecting the narrow-band incoherent light signal into a light source capable of lasing;
   suppressing the lasing modes outside of a bandwidth of the injected incoherent light signal by injecting the narrow-band incoherent light signal; and
   locking an output wavelength of the light source capable of lasing within the bandwidth of the injected incoherent light.

3. A method comprising:
   generating a narrow-band incoherent light signal from a superluminescent diode;
   externally injecting the narrow-band incoherent light signal into a light source capable of lasing;
   suppressing the lasing modes outside of a bandwidth of the injected incoherent light signal by injecting the narrow-band incoherent light signal; and
   locking an output wavelength of the light source capable of lasing within the bandwidth of the injected incoherent light.

4. A method comprising:
   externally injecting a narrow-band incoherent light signal into a light source capable of lasing, wherein the light source capable of lasing is a Fabry-Perot laser diodes;
   suppressing the lasing modes outside of a bandwidth of the injected incoherent light signal by injecting the narrow-band incoherent light signal; and
   locking an output wavelength of the light source capable of lasing within the bandwidth of the injected incoherent light.

5. The method of claim 4, further comprising:
   operating the Fabry-Perot laser diode as a semiconductor optical amplifier.

6. A method comprising:
   externally injecting a narrow-band incoherent light signal into a light source capable of lasing;
   suppressing the lasing modes outside of a bandwidth of the injected incoherent light signal by injecting the narrow-band incoherent light signal; and
   locking an output wavelength of the light source capable of lasing within the bandwidth of the injected incoherent light,
   wherein the lasing modes outside of the bandwidth of the injected incoherent light incur a side mode suppression ratio of ten decibels or more.

7. An apparatus, comprising:
   means for externally injecting a narrow-band incoherent light signal into a light source capable of lasing, wherein the narrow-band incoherent light signal is generated from an optical fiber amplifier;
   means for suppressing the lasing modes outside of a bandwidth of the injected incoherent light signal by injecting the narrow-band incoherent light signal; and
   means for locking an output wavelength of the light source capable of lasing within the bandwidth of the injected incoherent light.

8. An apparatus, comprising:
   means for externally injecting a narrow-band incoherent light signal into a light source capable of lasing, wherein the narrow-band incoherent light signal is generated from a light emitting diodes;
   means for suppressing the lasing modes outside of a bandwidth of the injected incoherent light signal by injecting the narrow-band incoherent light signal; and
   means for locking an output wavelength of the light source capable of lasing within the bandwidth of the injected incoherent light.

9. An apparatus, comprising:
   means for externally injecting a narrow-band incoherent light signal into a light source capable of lasing, wherein the narrow-band incoherent light signal is generated from a super-luminescent diodes;

means for suppressing the lasing modes outside of a bandwidth of the injected incoherent light signal by injecting the narrow-band incoherent light signal; and means for locking an output wavelength of the light source capable of lasing within the bandwidth of the injected incoherent light.

10. An apparatus, comprising:

means for externally injecting a narrow-band incoherent light signal into a light source capable of lasing, wherein the light source capable of lasing is a Fabry-Perot laser diode;

means for suppressing the lasing modes outside of a bandwidth of the injected incoherent light signal by injecting the narrow-band incoherent light signal; and means for locking an output wavelength of the light source capable of lasing within the bandwidth of the injected incoherent light.

11. The apparatus of claim 10, wherein the Fabry-Perot laser diode is operated as a semiconductor optical amplifier.

12. An apparatus, comprising:

an incoherent light source that generates a broadband incoherent light;

a coherent light source capable of lasing that can be modulated directly; and an optical circulator coupled to a coherent light source capable of lasing, wherein the optical circulator routes a spectral slice of the incoherent light to the coherent light source capable of lasing, the coherent light source capable of lasing emits a wavelength-selective output locked by the spectrally sliced incoherent light, and the optical circulator separates the output of the coherent light source capable of lasing from the broadband incoherent light.

13. The apparatus of claim 12, further comprising:

a polarization controller that is connected between the optical circulator and the coherent light source capable of lasing; and a polarizer that is connected at the output end of the optical circulator to improve the extinction ratio of the modulated signal.

14. The apparatus of claim 13, further comprising:

an optical filter that couples to the incoherent light source to slice the broadband incoherent light to produce a narrow-band incoherent light.

15. The apparatus of claim 12, further comprising:

an optical receiver to receive the wavelength selective output of the Fabry-Perot laser diode.

16. An apparatus, comprising:

an incoherent light source that generates a broadband incoherent light;

an optical filter coupled to the incoherent light source to spectrally slice the broadband incoherent light to produce a narrow-band incoherent light;

a Fabry-Perot laser diode that can be modulated directly; and an optical power splitter coupled to the optical filter and the Fabry-Perot laser diode to route the narrow-band incoherent light to the Fabry-Perot laser diode to cause the Fabry-Perot laser diode to emit a wavelength-selective output that is locked by the narrow-band incoherent light, wherein the optical power splitter separates the wavelength-selective output of the Fabry-Perot laser diode from the narrow-band incoherent light.

17. The apparatus of claim 16, further comprising:

a polarization controller that is connected between the optical power splitter and the Fabry-Perot laser diode; and a polarizer that is connected at an output end of the optical power splitter to improve the extinction ratio of the modulated signal.

18. The apparatus of claim 16, further comprising:

an optical receiver to receive the wavelength selective output of the Fabry-Perot laser diode.

19. A multi-channel wavelength division multiplexing system, comprising:

an incoherent light source that generates a broadband incoherent light;

a demultiplexer that slices spectrally the broadband incoherent light to produce a plurality of narrow-band incoherent light signals; and a plurality of coherent light sources capable of lasing to couple at the output ends of the demultiplexer, wherein each coherent light source capable of lasing to emit an output signal at a wavelength different from the other coherent light sources and each output signal is locked by an injected spectrally-sliced narrow-band incoherent light signal.

20. The multi-channel wavelength division multiplexing system of claim 19, wherein the demultiplexer multiplexes the output signals of the plurality of coherent light sources capable of lasing.

21. The multi-channel wavelength division multiplexing system of claim 19, further comprising:

an optical circulator coupled to the incoherent light source, wherein the optical circulator routes the broadband incoherent light to the demultiplexer and separates an output signal of the demultiplexer from the broadband incoherent light.

22. The multi-channel wavelength division multiplexing system of claim 19, wherein each coherent light source capable of lasing is a Fabry-Perot laser diodes operating as a semiconductor optical amplifier.

23. The multi-channel wavelength division multiplexing system of claim 19, wherein a bandwidth of the incoherent light source is within the free spectral range (FSR) of the demultiplexer.

24. The multi-channel wavelength division multiplexing system of claim 19, further comprises:

a plurality of receivers that receive a demultiplexed signal from the demultiplexer.

25. The multi-channel wavelength division multiplexing system of claim 19, wherein a first injected narrow-band incoherent light signal into a first coherent light source capable of lasing to suppress the lasing modes outside of the bandwidth of the first injected incoherent light.

26. A multi-channel wavelength division multiplexing system, comprising:

an incoherent light source that generates a broadband incoherent light;

a demultiplexer that slices spectrally the broadband incoherent light to produce a plurality of narrow-band incoherent lights;

an optical power splitter coupled to the incoherent light source to route the broadband incoherent light to the demultiplexer and to separate an output of the demultiplexer from the broadband incoherent light; and a plurality of Fabry-Perot laser diodes to couple to output ends of the demultiplexer, wherein each Fabry-Perot laser diode of the plurality of Fabry-Perot laser diodes emits a wavelength-selective output locked by an injected narrow-band incoherent light, and the emitted wavelength-selective output of a first Fabry-Perot laser diode is at a wavelength different from the emitted wavelength-selective outputs of the other Fabry-Perot laser diodes.

27. The multi-channel wavelength division multiplexing system of claim 26, wherein the demultiplexer multiplexes the output signals of the plurality of Fabry-Perot laser diodes.

28. The multi-channel wavelength division multiplexing system of claim 26, wherein two or more of the Fabry-Perot laser diodes can be modulated directly.

29. An optical transmission system in a passive optical network, comprising:
   a remote node that includes a first demultiplexer;
   a central office that includes an incoherent light source that generates a broadband incoherent light, a second demultiplexer, and a plurality of receivers that are coupled at the output ends of the second demultiplexer;
   a plurality of coherent light sources capable of lasing coupled to output ends of the first demultiplexer, wherein the first demultiplexer receives output signals from the plurality of coherent light sources capable of lasing to generate an upstream signal; and
   an optical fiber to connect the central office with the remote node, wherein the second demultiplexer receives the upstream signal and demultiplexes the upstream signal to the plurality of receivers.

30. The optical transmission system of claim 29, further comprising:
   an optical power splitter that is connected to the incoherent light source and routes the broadband incoherent light to the optical fiber connecting the central office and the remote node.

31. The optical transmission system of claim 30, wherein the optical power splitter delivers the upstream signal through the optical fiber to the second demultiplexer.

32. The optical transmission system of claim 29, further comprising:
   a plurality of optical network units that are connected to the remote node with a plurality of optical fibers, wherein the first demultiplexer receives the broadband incoherent light transmitted from the central offices, slices spectrally the broadband incoherent light to produce a plurality of narrow-band incoherent lights, and multiplexes the upstream signal transmitted from the optical network units through the plurality of optical fibers.

33. The optical transmission system of claim 29, wherein the plurality of coherent light sources capable of lasing include Fabry-Perot laser diodes that emit wavelength-selective outputs locked by the narrow-band incoherent lights.

34. A passive optical network; comprising:
   a remote node having a first demultiplexer to slice spectrally a broadband
   incoherent light to produce a plurality of narrow-band incoherent lights;
   a central office including an incoherent light source that generates the broadband incoherent light, a second demultiplexer that receives and demultiplexes an upstream signal, and a plurality of receivers that are connected at the output ends of the second demultiplexer;
   a plurality of optical network units that are connected to the remote node with a plurality of optical fibers, wherein the plurality of optical network units include coherent light sources capable of lasing that connect at the output ends of the first demultiplexer, and each coherent light source capable of lasing emits a wavelength-selective output locked by the narrow-band incoherent lights.

35. The passive optical network of claim 34, further comprising:
   an optical circulator in the remote node to route the broadband incoherent light delivered from the central office through the optical fiber to the first demultiplexer and the upstream signal from the first demultiplexer to the central office, wherein the plurality of optical network units generate the upstream signal.

36. The passive optical network of claim 34, wherein two or more of the coherent light sources capable of lasing can be modulated directly.

37. A passive optical network, comprising:
   a remote node that includes a first demultiplexer;
   a central office that includes a second demultiplexer, a plurality of receivers connected at the output ends of the second demultiplexer, and an incoherent light source that generates a broadband incoherent light having a bandwidth within the free spectral range (FSR) of the first demultiplexer;
   a single optical fiber to connect the remote node with the central office;
   a plurality of optical network units that include at least one Fabry-Perot laser diode that emits a wavelength-selective output locked by an injected narrow-band incoherent light, and
   a plurality of optical fibers to connect the plurality of optical network units at the output ends of the first demultiplexer, wherein the first demultiplexer slices spectrally the broadband incoherent light to produce a plurality of narrow-band incoherent wavelengths of lights, and multiplexes output signals transmitted from the optical network units.

38. The passive optical network of claim 37, further comprising:
   an optical circulator that connects to the incoherent light source to route the broadband incoherent light to the optical fiber.

39. The passive optical network of claim 37, further comprising:
   an optical power splitter that connects to the incoherent light source to route the broadband incoherent light to the optical fiber.

40. A passive optical network, comprising:
   a remote node that includes a first demultiplexer,
   a central office that includes an incoherent light source that generates a broadband incoherent light having a bandwidth within the free spectral range (FSR) of the first demultiplexer, and a second demultiplexer that demultiplexes an upstream signal received from the first demultiplexer to a plurality of receivers coupled to the second demultiplexer, wherein the first demultiplexer slices spectrally the broadband incoherent light to produce a plurality of narrow-band incoherent lights;
   a plurality of optical network units that include coherent light sources capable of lasing connected at the output ends of the first demultiplexer, which emit a wavelength-selective output locked by the narrow-band incoherent lights, wherein the first demultiplexer multiplexes the output signals transmitted from the coherent light sources capable of lasing; and
   an optical power splitter to route the broadband incoherent light to the first demultiplexer and the upstream signal from the first demultiplexer to the second demultiplexer.

* * * * *